United States Patent
Ma et al.

(10) Patent No.: US 12,312,474 B2
(45) Date of Patent: May 27, 2025

(54) METHOD OF MANUFACTURING PIGMENT

(71) Applicant: NINGBO INLIGHT TECHNOLOGY CO., LTD., Ningbo (CN)

(72) Inventors: Daoyuan Ma, Ningbo (CN); Lingjie Jay Guo, Ann Arbor, MI (US)

(73) Assignee: NINGBO INLIGHT TECHNOLOGY CO., LTD., Ningbo (CN)

( * ) Notice: Subject to any disclaimer, the term of this patent is extended or adjusted under 35 U.S.C. 154(b) by 1025 days.

(21) Appl. No.: 17/340,131

(22) Filed: Jun. 7, 2021

(65) Prior Publication Data

US 2021/0292568 A1 Sep. 23, 2021

Related U.S. Application Data

(63) Continuation of application No. PCT/CN2019/122760, filed on Dec. 3, 2019.

(30) Foreign Application Priority Data

Dec. 7, 2018 (CN) .......................... 201811496303.1

(51) Int. Cl.
  *C09C 1/00* (2006.01)
  *C09C 3/04* (2006.01)
  *C23C 14/00* (2006.01)
  *C23C 14/20* (2006.01)

(52) U.S. Cl.
  CPC .............. *C09C 1/0015* (2013.01); *C09C 3/04* (2013.01); *C23C 14/0005* (2013.01); *C23C 14/0015* (2013.01); *C23C 14/20* (2013.01)

(58) Field of Classification Search
  CPC ... C23C 14/20; C23C 14/0015; C23C 14/005; C23C 14/00; C09C 3/04; C09C 1/005
  See application file for complete search history.

(56) References Cited

U.S. PATENT DOCUMENTS

| 5,135,812 A | 8/1992 | Phillips et al. |
| 5,437,931 A | 8/1995 | Tsai et al. |
| 2006/0099420 A1* | 5/2006 | Bujard ................ C09C 1/0072 106/31.9 |

FOREIGN PATENT DOCUMENTS

| CN | 1152011 | * 6/1997 | ............. C09D 11/50 |
| CN | 1152011 A | 6/1997 | |
| CN | 1217735 A | 5/1999 | |
| CN | 1230577 A | 10/1999 | |
| CN | 1236795 A | 12/1999 | |
| CN | 1334843 A | 2/2002 | |
| CN | 1092220 C | 10/2002 | |

(Continued)

OTHER PUBLICATIONS

Chinese First office action, chinese Application No. 201811496303.1, mailed Oct. 27, 2020 (14 pages).

(Continued)

*Primary Examiner* — Pegah Parvini

(57) ABSTRACT

A method of manufacturing a pigment. The method includes: providing a substrate; forming stacked multiple sets of films successively on the substrate, wherein each set of films comprises a sacrificial layer and an optical film, the sacrificial layer and the optical film are successively stacked, and the sacrificial layer is a stripping agent with compressive stress or low stress; and obtaining the pigment by stripping and crushing formed multiple sets of films.

14 Claims, 2 Drawing Sheets

(56) References Cited

FOREIGN PATENT DOCUMENTS

| CN | 102757669 | * | 7/2012 | ............... C09C 1/00 |
| CN | 102757669 A | | 10/2012 | |
| CN | 103668067 A | | 3/2014 | |
| CN | 104593734 A | | 5/2015 | |
| CN | 105137519 A | | 12/2015 | |
| CN | 108922776 A | | 11/2018 | |

OTHER PUBLICATIONS

Chinese second office action, Chinese Application No. 201811496303.1, mailed Feb. 26, 2021 (16 pages).
International search report, International Application No. PCT/CN2019/122760, mailed Feb. 26, 2020 (10 pages).
Written Opinion of the International Search Authority in esponding International application No. PCT/CN2019/122760 (8 pages).

* cited by examiner

METHOD OF MANUFACTURING PIGMENT

CROSS-REFERENCE TO RELATED APPLICATIONS

The present disclosure is a continuation-application of International (PCT) Patent Application No. PCT/CN2019/122760 filed Dec. 3, 2019, which claims foreign priority of Chinese Patent Application No. 2018114963031 and application name of "METHOD OF MANUFACTURING PIGMENT", filed on Dec. 7, 2018 in the State Intellectual Property Office of China, the contents of all of which are hereby incorporated by reference.

TECHNICAL FIELD

The present disclosure relates to the field of film technologies, and in particular, to a method of manufacturing a pigment.

BACKGROUND

Structural color, also known as physical color, is a variety of colors produced by refraction, diffuse reflection, diffraction or interference of light waves caused by minute structures such as an extremely thin wax layer, carved points, grooves or scales on an insect body wall. With product of structural color technology, manufacture of a pigment based on an optical film is becoming more and more important.

In the prior art, methods of manufacturing the pigment based on the optical film include a winding coating method of roll to roll, and a method that multiple layers are stacked on a box type coating machine with a stripping agent as a sacrificial layer sandwiched between the multiple layers. However, in a long-term research and development process, inventors of the present disclosure have found that a winding coating equipment is expensive and production efficiency is low, and in a method that the multiple layers are stacked on a box type coating machine with a stripping agent of sodium chloride as the sacrificial layer sandwiched between the multiple layers, layer a falls off irregularly in the production process, resulting in production interruption.

SUMMARY

A main technical problem solved by the present disclosure is to provide a method of manufacturing a pigment, thus irregular falling off of a film in production process can be avoided without increasing production cost, so as to avoid the production interruption.

In order to solve the above technical problem, a technical solution adopted in the present disclosure is to provide a method of manufacturing a pigment. The method comprises: providing a substrate; forming stacked multiple sets of films successively on the substrate, wherein each set of films comprises a sacrificial layer and an optical film, the sacrificial layer and the optical film are successively stacked, and the sacrificial layer is a stripping agent with compressive stress or low stress; and obtaining the pigment by stripping and crushing formed multiple sets of films.

In order to solve the above technical problem, another technical solution adopted in the present disclosure is to provide a method of manufacturing a pigment. The method comprises: providing a substrate; forming multiple sacrificial layers and multiple optical films on the substrate, wherein a sacrificial layer and an optical film are successively alternately stacked multiple sets of films successively each set of films comprises a sacrificial layer and an optical film, and the sacrificial layer is a stripping agent with compressive stress or low stress; and obtaining the pigment by stripping and crushing formed multiple sacrificial layers and multiple optical films.

In order to solve the above technical problem, another technical solution adopted in the present disclosure is to provide a method of manufacturing a pigment. The method comprises: providing a substrate; forming a set of films on the substrate, wherein the set of films comprises a sacrificial layer and an optical film, the sacrificial layer and the optical film are successively stacked, and the sacrificial layer is a stripping agent with compressive stress or low stress; forming stacked multiple sets of films successively by repeating forming the set of films; and obtaining the pigment by stripping and crushing formed multiple sets of films.

DETAILED DESCRIPTION OF THE PREFERRED EMBODIMENTS

Figure 1:
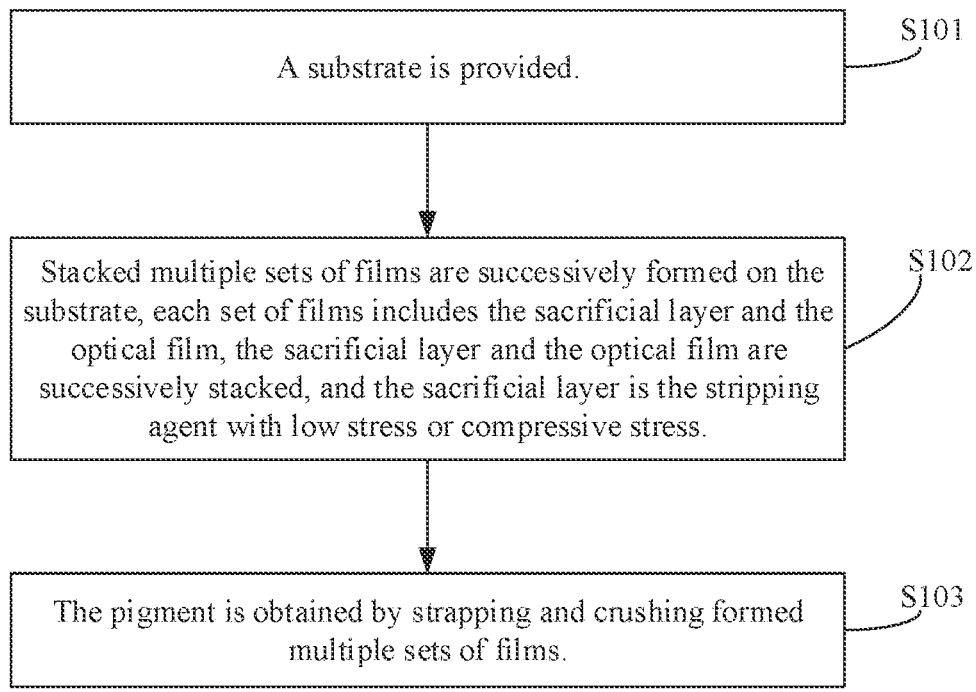
FIG. 1 is flowchart of a method of manufacturing a pigment provided by an embodiment of the present disclosure.

Before describing the method of the present disclosure in detail, basic knowledge and the prior art related to the present disclosure are introduced.

Structural color, also known as physical color, is a kind of luster caused by an interaction between light and structures. For example, because there are an extremely thin wax layer, carved points, grooves or scales on a insect body wall, light waves can be refracted, diffused, diffracted or interfered to produce various colors. A pigment based on an optical film can be obtained after the optical film producing colors are produced by industrial production in a large-scale way according to a principle that color is produced by optical structures.

At present, there is no unified professional name for the pigment based on the optical film, such as a photochromic pigment, a photochromic pigment based on optical interference, and a pearlescent pigment. This kind of pigment can be divided into two categories, commonly known as: a chameleon pigment and an omnidirectional pigment, according to pigment performance by market. In short, the chameleon pigment has different colors when viewed from different angles, such as "100" in RMB 100 yuan note and $100 dollar bill, the omnidirectional pigment is also known as unchangeable color pigment, that is, when observed from different angles, color is close and change is small.

A principle of the pigment based on the optical film is similar to that of pearl luster. Newton's optical theory pointed out that sunlight is composed of many different colors of light. In the sunlight, opaque substance absorbs or transmits incident light with certain wavelength, and reflected light with another wavelength is a color of the opaque substance. For multilayer optical films, color of reflected light varies with the number, thickness and refractive index of layers. Because the reflected light and transmitted light come from a same light wave, optical path difference of the two lights decomposed by the incident light is different. When they meet a condition of coherent light, they can produce light interference and produce a specific color. The above is the principle of the pigment based on the optical film.

In the prior art, methods of manufacturing the pigment based on the optical film may include a winding coating method of roll to roll, or a method that multiple layers are stacked on a box type coating machine with a stripping agent as a sacrificial layer between the multiple layers. However, a winding coating equipment is expensive and production efficiency is low, and in a method that the multiple layers are stacked on a box type coating machine with a stripping agent of sodium chloride as the sacrificial layer between the multiple layers, a layer fall off irregularly in the production process, resulting in production interruption.

A method of manufacturing the pigment of the present disclosure is a method of manufacturing the pigment based on the optical film. Since the sacrificial layer is a stripping agent with low stress or compressive stress, total stress of the multilayer optical films is tensile stress, and the stripping agent is separated between the multilayer optical films, separation of the stripping agent reduces transmission and accumulation of tensile stress of the multilayer optical films, resulting in reducing total stress of multiple sets of films. In this way, irregular falling off of a film in production process can be avoided without increasing production cost, so as to avoid the production interruption.

Details of the present disclosure will be described below.

Referring to FIG. 1, FIG. 1 is a flowchart of the method of manufacturing the pigment provided by of an embodiment of the present disclosure. The method may include the following operations illustrated at blocks in FIG. 1.

At block S101, a substrate is provided.

The substrate is usually made of polyester, polyester, polyimide, glass or metal. Specifically, polyethylene terephthalate (PET) is mostly used in the polyester, and polyvinyl chloride (PVC) is mostly used in the polyester. The substrate can be chosen according to actual production.

At block S102, stacked multiple sets of films are successively formed on the substrate, each set of films includes the sacrificial layer and the optical film, the sacrificial layer and the optical film are successively stacked, and the sacrificial layer is the stripping agent with low stress or compressive stress.

In the embodiment, the sacrificial layer is the stripping agent with low stress or compressive stress. The ompressive stress is stress that resists a compression tendency of an object. In a specific practical application, the stripping agent with low stress or compressive stress can be found through tests, or verified by the tests after being preliminarily determined according to experience. Specifically, in the embodiment, the sacrificial layer may only include the stripping agent with low stress or compressive stress, or a mixture of the stripping agent and other stripping material, and the like. Furthermore, content and a thickness of the stripping agent are determined according to actual needs, and can be determined by two tests in the production process. In one embodiment, the stripping agent is a soluble substance capable of producing the compressive stress or the low stress in a film after evaporation coating.

The stripping agent can be at least one of inorganic salt, organic acid salt, base salt, and the like. The inorganic salt can be at least one of hydrochloride, nitrate, sulfate, phosphate and carbonate. The organic acid salt can be at least one of acrylate, acetate and stearate. The base salt can be at least one of NaOH, KOH and $Ca(OH)_2$.

Of course, the stripping agent can also be other soluble substances that can produce the compressive stress or the low stress in the film after evaporation coating, and there is no specific limitation here.

In the prior art, materials of the sacrificial layer are free of containing a stripping agent with the compressive stress. For example, for a material using sodium chloride as the stripping agent, due to the accumulation of tensile stress in coating process, the film will fall off irregularly in the coating process, resulting in the production interruption and reducing the production efficiency. In the embodiment, the sacrificial layer is the stripping agent with low stress or compressive stress, while total stress of the multilayer optical films is tensile stress. The stripping agent is sandwiched between the multilayer optical films and partially offsets the transmission and accumulation of the tensile stress of the optical film, resulting in reducing the total stress of multiple sets of films and avoiding the irregular falling off of the film in the production process. In this way, the film falling off irregularly in the production process can be avoided, and the production process is not interrupted on basis of not increasing the production cost, so as to improve the production efficiency.

In one application scenario, the optical film may include at least one of a dielectric layer, a semiconductor layer, a metal layer, and the like. Specifically, the dielectric layer can be formed by silicon oxide, aluminum oxide, titanium oxide, zirconia, or the like, and can be formed by vacuum deposition such as electron beam heating evaporation, magnetron sputtering evaporation, resistance heating evaporation, or the like. The semiconductor layer can be formed by silicon, germanium, or the like through vacuum deposition such as electron beam heating evaporation, resistance heating evaporation and so on. The metal layer can be formed by silver, chromium, copper, nickel, aluminum, or the like through the vacuum deposition such as electron beam heating evaporation, resistance heating evaporation and so on. Of course, the optical film can also include other layers, and there is no specific limitation here.

Figure 2:
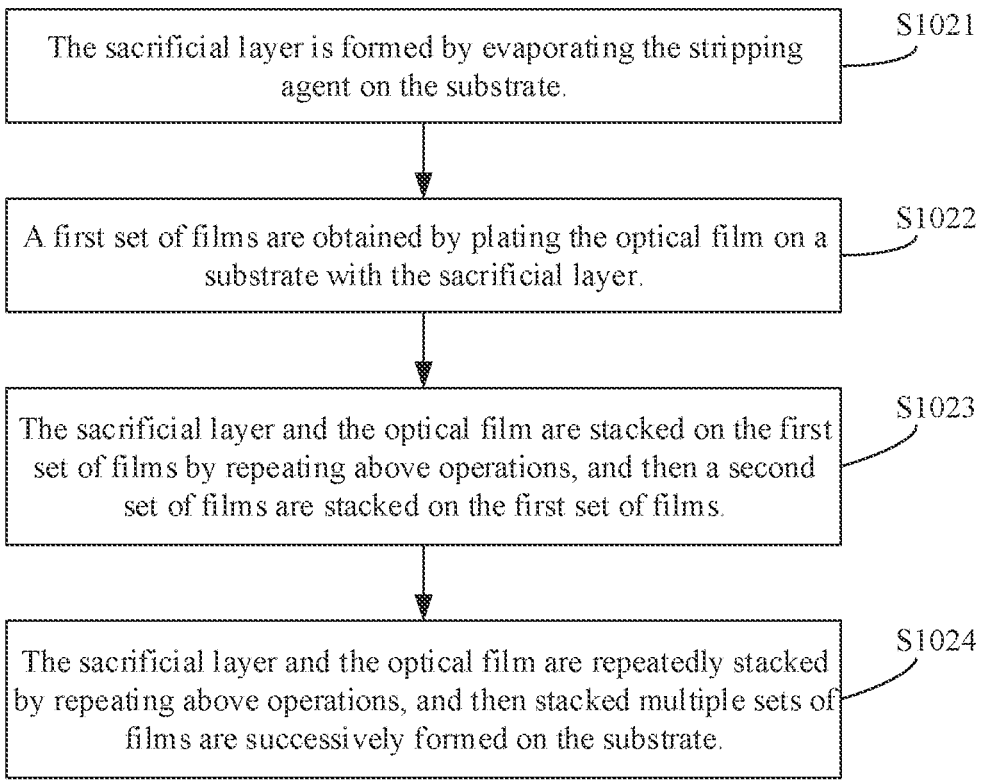
FIG. 2 is flowchart of a method of manufacturing a pigment provided by another embodiment of the present disclosure.

Specifically, referring to FIG. 2, operations at block S102 may include sub-operations at block S1021, sub-operations at block S1022, sub-operations at block S1023, and sub-operations at block S1024.

At block S1021, the sacrificial layer is formed by evaporating the stripping agent on the substrate.

At block S1022, a first set of films are obtained by plating the optical film on a substrate with the sacrificial layer.

Specifically, at least one of physical vapor deposition (PVD), chemical vapor deposition (CVD), atomic layer deposition (ALD) and the like can be used for plating the optical film in response to the optical film being plated. In response to the physical vapor deposition being used for plating, at least one method of resistance thermal evaporation, electron beam evaporation, sputtering and ion assisted evaporation can be used. In actual operation process, it can be selected according to the actual needs. There is no specific restriction here.

At block S1023, the sacrificial layer and the optical film are stacked on the first set of films by repeating above operations, and then a second set of films are stacked on the first set of films.

At block S1024, the sacrificial layer and the optical film are repeatedly stacked by repeating above operations, and then stacked multiple sets of films are successively formed on the substrate.

Figure 3:
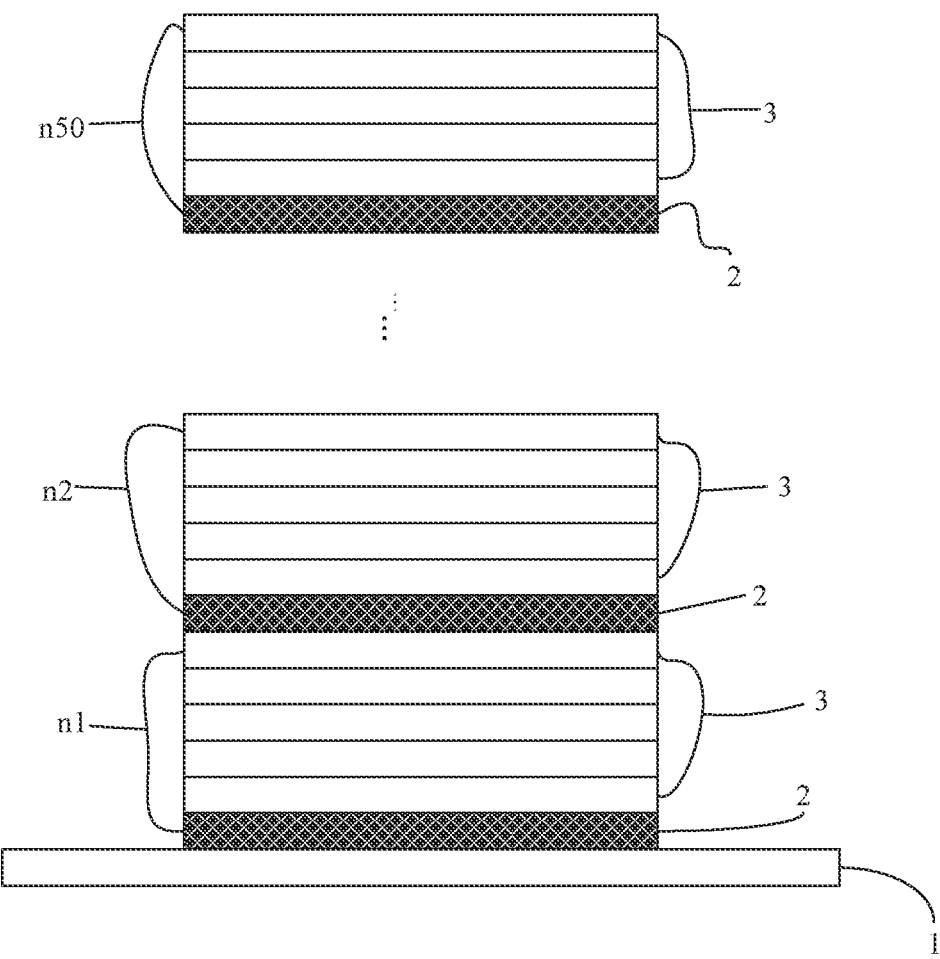
FIG. 3 is a schematic view of stacked multiple sets of films formed by operations at block S102 of the method of manufacturing the pigment of the present disclosure in a practical application.

For example, referring to FIG. 3, FIG. 3 is a schematic view of the stacked multiple sets of films formed by the operations at block S102 in a practical application. In the practical application, the sacrificial layer 2 adopts the stripping agent in the above embodiment, taking the number of sets of films is 50 as an example, the sacrificial layer 2 is evaporated on the substrate 1, and the optical film 3 is further plated on the substrate 1 with the sacrificial layer 2 to obtain the first set of films n1. Both the sacrificial layer 2 and the optical film 3 are evaporated by a vacuum coater, then, the sacrificial layer 2 and the optical film 3 are stacked on the first set of films n1 by repeating the above operations, and then the second set of films n2 is stacked on the first set of films n1. The sacrificial layer 2 and the optical film 3 are repeatedly stacked by repeating the above operations, and 50 sets of films n50 are successively formed on the substrate.

The substrate is put into a vacuum chamber of the vacuum coater, and the sacrificial layer is formed by evaporating and depositing the stripping agent, and the optical film is plated on the sacrificial layer. The sacrificial layer and the optical film form the set of films, and then multiple sets of the films are repeatedly stacked and plated. Because the total stress of the multiple sets of films is tensile stress and the stripping agent is sandwiched between the multiple sets of films, and the compressive stress of the stripping agent partially blocks and offsets the transmission and accumulation of the tensile stress, resulting in reducing the total stress of multiple sets of films. The irregular falling off of the film during the production process can be avoided and up to 50 sets of films can be deposited. However, in the prior art, a sodium chloride with tensile stress is used as as sacrificial layer. Only about 10 sets of films can be deposited due to large total stress and irregular falling off of the film.

Due to the compressive stress or the low stress of the stripping agent, multiple sets of stacked films can not fall off during the coating process, and the production process is not interrupted. Therefore, it is not necessary to use an expensive equipment, and only an ordinary vacuum coater can be used to plate the stacked multiple sets of films, so as to ensure that the production cost is not increased.

Further, operations at block S102 can specifically be the stacked multiple sets of films are successively formed on the substrate by using a box type vacuum coater.

At block S103, the pigment is obtained by strapping and crushing formed multiple sets of films.

Plated multiple sets of films can be trapped and crushed, for example, can be put into an ultrasonic tank containing acetone or methyl ethyl ketone solution or water and then be broken by ultrasonic for about 30 minutes.

In the embodiment of the present disclosure, the substrate is provided, the stacked multiple sets of films are successively formed on the substrate, each set of films includes the sacrificial layer and the optical film, the sacrificial layer is the stripping agent with low stress or compressive stress, and the pigment is obtained by stripping and crushing formed multiple sets of the films are respectively. Because the sacrificial layer is the stripping agent with low stress or compressive stress, the total stress of the multilayer optical films is tensile stress, and the stripping agent is sandwiched between the multilayer optical films, the compressive stress or the low stress of the stripping agent partially blocks the transmission of tensile stress of the multilayer optical films, resulting in reducing the total stress of the multiple sets of films and avoiding the film falling off irregularly in the production process. In this way, the film falling off irregularly in the production process can be avoided on the basis of not increasing the production cost, so as to avoid the production interruption.

The optical film is formed by depositing materials with different refractive index on a same carrier alternately in high vacuum according to requirements of film system structure. Materials are evaporated to the carrier in a form of molecules or atoms. In order to ensure uniformity and compactness of the film, consistency of evaporation rate must be strictly controlled. In order to control color index of film system, error of film thickness must be controlled in the range of Angstrom. This shows precision and particularity of optical film production. At present, an ideal optical film is symmetrical structure, and a thickness of the film system is about 1 μm. Because the film system is made in the high vacuum, all materials used are colorless or transparent inorganic materials, the pigment based on the optical film has stable performance, compact structure, no fading, strong weather resistance, good shear resistance, and can be arbitrarily crushed according to ink particle size requirements.

Furthermore, the number of sets of films formed by superposition above can be 10-55 sets.

In the prior art, a material of the sacrificial layer used is sodium chloride, and the film falls off irregularly: sometimes 15 sets fall off, sometimes 5 sets fall off, resulting in bringing trouble to production process of the optical film, and interrupting the production process frequently and irregularly. In the embodiment, the number of the stacked sets films can reach 10-55 sets, or even more than 55 sets.

In one embodiment, the pigment is flake.

Furthermore, in one application, the pigment is in a form of thin sheet with a thickness of 0.015-1 μm and a length of 5-200 μm and a width of 5-200 μm.

It should be noted that a shape and particle size of the pigment are determined according to an actual application scenarios or a printing method, a spraying method and so on.

The method also includes the following: determining a thickness of the sacrificial layer in advance.

The thickness of the sacrificial layer can be determined by experience, and it is necessary to ensure that the multilayer optical films can be separated, that is, the substrate and the multilayer optical films can be separated.

The thickness of the sacrificial layer can also be determined by tests. That is to say, the thickness of the sacrificial layer can be determined in advance can be that the thickness of the sacrificial layer can be adjusted through multiple tests in advance so that the sacrificial layer is capable of separating the multilayer optical films during the stripping process. Generally speaking, the thickness of the sacrificial layer can be obtained by three tests.

After crushing treatment, if the pigment is not easy to be well dispersed in ink binder, surface treatment of the pigment can be further conducted, that is, the method may also include conducting the surface treatment of the pigment after the crushing treatment.

For example, general surface treatment is to put a crushed pigment into saturated solution of rosin or stearic acid (such as dehydroabietic acid, tetrahydrorosinic acid, etc.), stir for more than half an hour, then precipitate, filter and dry. The pigment after the surface treatment is evenly mixed into transparent ink binder, and then an appropriate amount of cosolvent and rheological control agent are added. Commonly used ink binder may include rosin modified phenolic resin, maleic acid resin, or polyamide resin, etc. The cosolvent helps to stabilize or use compound, and the cosolvent may include glycol ether, or glycol ether acetate, etc. It is necessary to add a small amount of rheological control agent into the pigment to improve ink performance. The rheological control agent may include spodumene clay, baking silica, bentonite clay, or cellulose, etc. It should be noted that proportion of the above added substances does not affect spectral characteristics of the ink.

The above description merely illustrates some exemplary embodiments of the disclosure, which however are not intended to limit the scope of the disclosure to these specific embodiments. Any equivalent structural or flow modifications or transformations made to the disclosure, or any direct or indirect applications of the disclosure on any other related fields, shall all fall in the scope of the disclosure.

What is claimed is:

1. A method of manufacturing a pigment, comprising:
   providing a substrate;
   forming stacked multiple sets of films successively on the substrate, wherein each set of films comprises a sacrificial layer and an optical film, the sacrificial layer and the optical film are successively stacked, and the sacrificial layer is a stripping agent with compressive stress or low stress; and
   obtaining the pigment by stripping and crushing formed multiple sets of films,
   wherein the stripping agent is a soluble substance capable of producing the compressive stress or the low stress in a film after evaporation coating, the stripping agent is at least one of inorganic salt, organic acid salt and base salt,
   the inorganic salt is at least one of hydrochloride, nitrate, sulfate, phosphate and carbonate; the organic acid salt is at least one of acrylate, acetate and stearate; and the base salt is at least one of NaOH, KOH and $Ca(OH)_2$.

2. The method according to claim 1, wherein the forming stacked multiple sets of films successively on the substrate, comprises:
   forming the sacrificial layer by evaporating a stripping agent on the substrate;
   obtaining a first set of films by plating the optical film on a substrate with the sacrificial layer; and
   stacking the sacrificial layer and the optical film on the first set of films by repeating above steps, and then stacking a second set of films on the first set of films, repeatedly stacking the sacrificial layer and the optical film by repeating above steps, and then successively forming the stacked multiple sets of films on the substrate.

3. The method according to claim 2, wherein in response to the optical film being plated on the substrate with the sacrificial layer, methods for plating the optical film comprises at least one of physical vapor deposition, chemical vapor deposition and atomic layer deposition.

4. The method according to claim 3, wherein the physical vapor deposition is at least one of resistance thermal evaporation, electron beam evaporation, sputtering and ion assisted evaporation.

5. The method according to claim 2, wherein the number of the stacked multiple sets of films is 10-55 sets.

6. The method according to claim 1, wherein the optical film comprises at least one of a dielectric layer, a semiconductor layer and a metal layer.

7. The method according to claim 6, wherein the dielectric layer is formed by silicon oxide, aluminum oxide, titanium oxide, or zirconia;
   the semiconductor layer is formed by silicon or germanium; and
   the metal layer is formed by silver, chromium, copper, nickel, or aluminum.

8. The method according to claim 1, wherein total stress of multilayer optical films is tensile stress.

9. The method according to claim 1, wherein the pigment is in a form of thin sheet with a thickness of 0.015-1 μm and a length of 5-200 μm and a width of 5-200 μm.

10. The method according to claim 1, further comprising:
    conducting surface treatment of the pigment after crushing treatment.

11. A method of manufacturing a pigment, comprising:
    providing a substrate;
    forming multiple sacrificial layers and multiple optical films on the substrate, wherein a sacrificial layer and an optical film are successively alternately stacked multiple sets of films successively, each set of films comprises a sacrificial layer and an optical film, and the sacrificial layer is a stripping agent with compressive stress or low stress; and
    obtaining the pigment by stripping and crushing formed multiple sacrificial layers and multiple optical films,
    wherein the stripping agent is a soluble substance capable of producing the compressive stress or the low stress in a film after evaporation coating, the stripping agent is at least one of inorganic salt, organic acid salt and base salt,
    the inorganic salt is at least one of hydrochloride, nitrate, sulfate, phosphate and carbonate; the organic acid salt is at least one of acrylate, acetate and stearate; and the base salt is at least one of NaOH, KOH and $Ca(OH)_2$.

12. The method according to claim 11, wherein the pigment is in a form of thin sheet with a thickness of 0.015-1 μm and a length of 5-200 μm and a width of 5-200 μm.

13. The method according to claim 11, wherein total stress of the multilayer optical films is tensile stress.

14. A method of manufacturing a pigment, comprising:
    providing a substrate;
    forming a set of films on the substrate, wherein the set of films comprises a sacrificial layer and an optical film, the sacrificial layer and the optical film are successively stacked, and the sacrificial layer is a stripping agent with compressive stress or low stress;
    forming stacked multiple sets of films successively by repeating forming the set of films; and
    obtaining the pigment by stripping and crushing formed multiple sets of films,
    wherein the stripping agent is a soluble substance capable of producing the compressive stress or the low stress in a film after evaporation coating, the stripping agent is at least one of inorganic salt, organic acid salt and base salt,
    the inorganic salt is at least one of hydrochloride, nitrate, sulfate, phosphate and carbonate; the organic acid salt is at least one of acrylate, acetate and stearate; and the base salt is at least one of NaOH, KOH and $Ca(OH)_2$.

* * * * *